(12) United States Patent
Kang

(10) Patent No.: US 11,004,921 B2
(45) Date of Patent: *May 11, 2021

(54) ORGANIC LIGHT-EMITTING DISPLAY DEVICE AND MANUFACTURING METHOD THEREOF

(71) Applicant: Samsung Display Co., Ltd., Yongin-si (KR)

(72) Inventor: Tae Wook Kang, Seongnam-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 16/831,557

(22) Filed: Mar. 26, 2020

(65) Prior Publication Data

US 2020/0227493 A1 Jul. 16, 2020

Related U.S. Application Data

(60) Continuation of application No. 16/455,693, filed on Jun. 27, 2019, now Pat. No. 10,636,853, which is a
(Continued)

(30) Foreign Application Priority Data

Nov. 15, 2016 (KR) .................. 10-2016-0151626

(51) Int. Cl.
*H01L 27/32* (2006.01)
*H01L 51/52* (2006.01)

(52) U.S. Cl.
CPC ...... *H01L 27/3246* (2013.01); *H01L 27/3276* (2013.01); *H01L 51/5228* (2013.01);
(Continued)

(58) Field of Classification Search
CPC ......... H01L 21/76897; H01L 21/28173; H01L 21/28282; H01L 21/31116;
(Continued)

(56) References Cited

U.S. PATENT DOCUMENTS 9,035,330 B2 5/2015 Kang et al.
9,041,026 B2 5/2015 Yamazaki
(Continued)

FOREIGN PATENT DOCUMENTS

EP 2744008 6/2014
JP 2005316412 11/2005
(Continued)

OTHER PUBLICATIONS

Examination Result dated Jul. 24, 2020, in European Patent Application No. 17179764.0.
(Continued)

*Primary Examiner* — Zandra V Smith
*Assistant Examiner* — Andre C Stevenson
(74) *Attorney, Agent, or Firm* — H.C. Park & Associates, PLC

(57) ABSTRACT

A method of manufacturing an OLED device includes: preparing a substrate on which a first conductive layer and a pixel defining film defining a plurality of pixels and exposing the first conductive layer for each of the plurality of pixels; disposing a photoresist pattern on the pixel defining film, the photoresist pattern comprising an opening exposing a first pixel of the plurality of pixels; disposing a first material layer onto an entire surface of the substrate to simultaneously dispose an organic light-emitting layer and a first deposition layer; disposing a second material layer onto the entire surface of the substrate to simultaneously dispose a second conductive layer and a second deposition layer; disposing a third material layer onto the entire surface of the
(Continued)

substrate to simultaneously dispose a protection layer and a third deposition layer; and removing the photoresist pattern and the first, second, and third deposition layers.

11 Claims, 13 Drawing Sheets

Related U.S. Application Data division of application No. 15/478,723, filed on Apr. 4, 2017, now Pat. No. 10,374,020.

(52) U.S. Cl.
CPC ...... *H01L 51/5253* (2013.01); *H01L 51/5262* (2013.01); *H01L 51/5284* (2013.01); *H01L 27/322* (2013.01); *H01L 27/3211* (2013.01); *H01L 2227/323* (2013.01)

(58) Field of Classification Search
CPC ......... H01L 21/31144; H01L 21/76805; H01L 21/76819
See application file for complete search history.

(56) References Cited

U.S. PATENT DOCUMENTS

| | | | |
|---|---|---|---|
| 9,093,669 B2 | 7/2015 | Park et al. | |
| 9,246,123 B2 | 1/2016 | Kim et al. | |
| 9,401,390 B2 | 7/2016 | Song et al. | |
| 9,673,210 B1* | 6/2017 | Thees | H01L 29/40117 |
| 9,786,866 B2 | 10/2017 | Maeda | |
| 10,636,853 B2* | 4/2020 | Kang | H01L 51/5253 |
| 2009/0015153 A1 | 1/2009 | Asano | |
| 2009/0039433 A1* | 2/2009 | Yang | H01L 21/82345 |
| | | | 257/365 |
| 2010/0078627 A1 | 4/2010 | Yoshinaga | |
| 2012/0081909 A1 | 4/2012 | Nishida et al. | |
| 2012/0161167 A1 | 6/2012 | Yamazaki | |
| 2014/0353611 A1 | 12/2014 | Choi et al. | |
| 2015/0017321 A1 | 1/2015 | Kudo et al. | |
| 2016/0104760 A1 | 4/2016 | Maeda | |
| 2016/0118450 A1 | 4/2016 | Lee et al. | |
| 2016/0248039 A1 | 8/2016 | Choung et al. | |

FOREIGN PATENT DOCUMENTS

| | | |
|---|---|---|
| JP | 2011238597 | 11/2011 |
| JP | 2012178336 | 9/2012 |
| JP | 2016076453 | 5/2016 |
| KR | 10-2014-0085979 | 7/2014 |
| KR | 10-2014-0088739 | 7/2014 |
| KR | 10-2015-0033141 | 4/2015 |
| KR | 10-2016-0047673 | 5/2016 |
| WO | 2014/104703 | 7/2014 |
| WO | 2016019273 | 2/2016 |

OTHER PUBLICATIONS

Partial Search Report dated Mar. 2, 2018, in European Patent Application No. 17179764.0.
Non-Final Office Action dated Jan. 12, 2018, in U.S. Appl. No. 15/478,723.
Final Office Action dated May 22, 2018, in U.S. Appl. No. 15/478,723.
Final Office Action dated Oct. 5, 2018, in U.S. Appl. No. 15/478,723.
Notice of Allowance dated Mar. 25, 2019, in U.S. Appl. No. 15/478,723.
Notice of Allowance dated Dec. 30, 2019, in U.S. Appl. No. 16/455,693.
Office Action dated Feb. 24, 2021, in Japanese Patent Application No. 2017-108464.

* cited by examiner

ORGANIC LIGHT-EMITTING DISPLAY DEVICE AND MANUFACTURING METHOD THEREOF

CROSS-REFERENCE TO RELATED APPLICATION

This application is a Continuation of U.S. patent application Ser. No. 16/455,693, filed on Jun. 27, 2019, which issued as U.S. Pat. No. 10,636,853, which is a Division of U.S. patent application Ser. No. 15/478,723, filed on Apr. 4, 2017, which issued as U.S. Pat. No. 10,374,020, which claims priority to and the benefit of Korean Patent Application No. 10-2016-0151626, filed on Nov. 15, 2016, each of which is hereby incorporated by reference for all purposes as if fully set forth herein.

BACKGROUND

Field

Exemplary embodiments relate to an organic light-emitting display device and a manufacturing method thereof.

Discussion of the Background

An organic light-emitting display device is a self-emission type of display device, and therefore does not require a backlight unit, unlike a light-receiving type display device such as a liquid crystal display device. Accordingly, the organic light-emitting display device is used for various slim electrical/electronic products, such as smart phones, ultra-slim TVs, and the like.

Conventionally, a method of depositing an organic light-emitting element by photo-patterning using a photo-mask is used to realize high resolution.

However, a lift-off layer used in the photo-patterning includes a special material that is expensive, and the process of removing the lift-off layer may damage the deposited organic layer.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide an organic light-emitting display device, which can prevent or reduce damage to an organic light-emitting layer from external air or physical and chemical impacts generated during a process, and a manufacturing method thereof.

Additional aspects will be set forth in the detailed description which follows, and, in part, will be apparent from the disclosure, or may be learned by practice of the inventive concept.

According to an exemplary embodiment, an organic light-emitting display device may include: a substrate; a first conductive layer disposed on the substrate; a pixel defining film disposed to define a plurality of pixels on the substrate, the pixel defining film exposing at least a part of the first conductive layer for each of the plurality of pixels; an organic light-emitting layer disposed on the at least a part of the first conductive layer exposed by the pixel defining film; a second conductive layer disposed on the organic light-emitting layer; a protection layer disposed in each of the plurality of pixels on the second conductive layer and exposing at least a part of the second conductive layer; and a sub-conductive layer disposed on the pixel defining film between the plurality of pixels, the sub-conductive layer electrically contacting with exposed portions of the second conductive layer disposed in the plurality of pixels.

The protection layers may be disposed in the respective pixels are not in contact with each other.

The second conductive layers may be disposed in the respective pixels are not in direct contact with each other.

The organic light-emitting layer may be surrounded and sealed by the protection layer, the pixel defining film, the first conductive layer, and the sub-conductive layer.

The protection layer may include an inorganic material.

The sub-conductive layer may not be disposed on at least a part of the protection layer.

The pixel defining film may include a first layer including an organic material, and a second layer including an inorganic material and covering the first layer.

According to an exemplary embodiment, an organic light-emitting display device may include: a substrate; a first conductive layer disposed on the substrate; a pixel defining film disposed to define at least one pixel on the substrate, the pixel defining film exposing at least a part of the first conductive layer in the at least one pixel; an organic light-emitting layer disposed on at least a part of the first conductive layer exposed by the pixel defining film; a second conductive layer disposed on the organic light-emitting layer; a protection layer disposed in each pixel of the at least one pixel on the second conductive layer and exposing at least a part of the second conductive layer; and a sub-conductive layer disposed outside the each pixel of the at least one pixel, the sub-conductive layer electrically contacting with exposed portions of the second conductive layer.

At least a part of the protection layer may contact with the sub-conductive layer.

The organic light-emitting display device may further include a color filter disposed between the protection layer and the sub-conductive layer.

According to an exemplary embodiment, a method of manufacturing an organic light-emitting display device may include: preparing a substrate on which a first conductive layer and a pixel defining film defining a plurality of pixels and exposing the first conductive layer for each of the plurality of pixels; disposing a photoresist pattern on the pixel defining film, the photoresist pattern including an opening exposing a first pixel of the plurality of pixels; disposing a first material layer onto an entire surface of the substrate to simultaneously dispose; an organic light-emitting layer on a portion of the first conductive layer exposed by the pixel defining film, and a first deposition layer on the photoresist pattern; disposing a second material layer onto the entire surface of the substrate to simultaneously dispose; a second conductive layer on the organic light-emitting layer, and a second deposition layer on the first deposition layer; disposing a third material layer onto the entire surface of the substrate to simultaneously dispose; a protection layer on the second conductive layer, and a third deposition layer on the second deposition layer; and removing the photoresist pattern and the first, second, and third deposition layers.

At least a part of the protection layer may contact with the pixel defining film.

The protection layer may completely cover the first conductive layer and the organic light-emitting layer.

The organic light-emitting layer may be surrounded and sealed by the protection layer, the pixel defining film, and the first conductive layer.

The photoresist pattern may have an inverted taper shape.

The photoresist pattern may be formed by patterning a negative photoresist composition.

The photoresist pattern may be removed by a lift-off process using a stripper.

The method of manufacturing an organic light-emitting display device may further include, after removing the photoresist pattern: disposing an organic light-emitting layer, a second conductive layer and a protection layer in a second pixel of the plurality of pixels; etching a part of the protection layers in the first pixel and the second pixel of the plurality of pixels to expose a part of the second conductive layers in the first pixel and the second pixel of the plurality of pixels; and forming a sub-conductive layer to electrically connect the exposed portions of the second conductive layers in the first pixel and the second pixel of the plurality of pixels.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
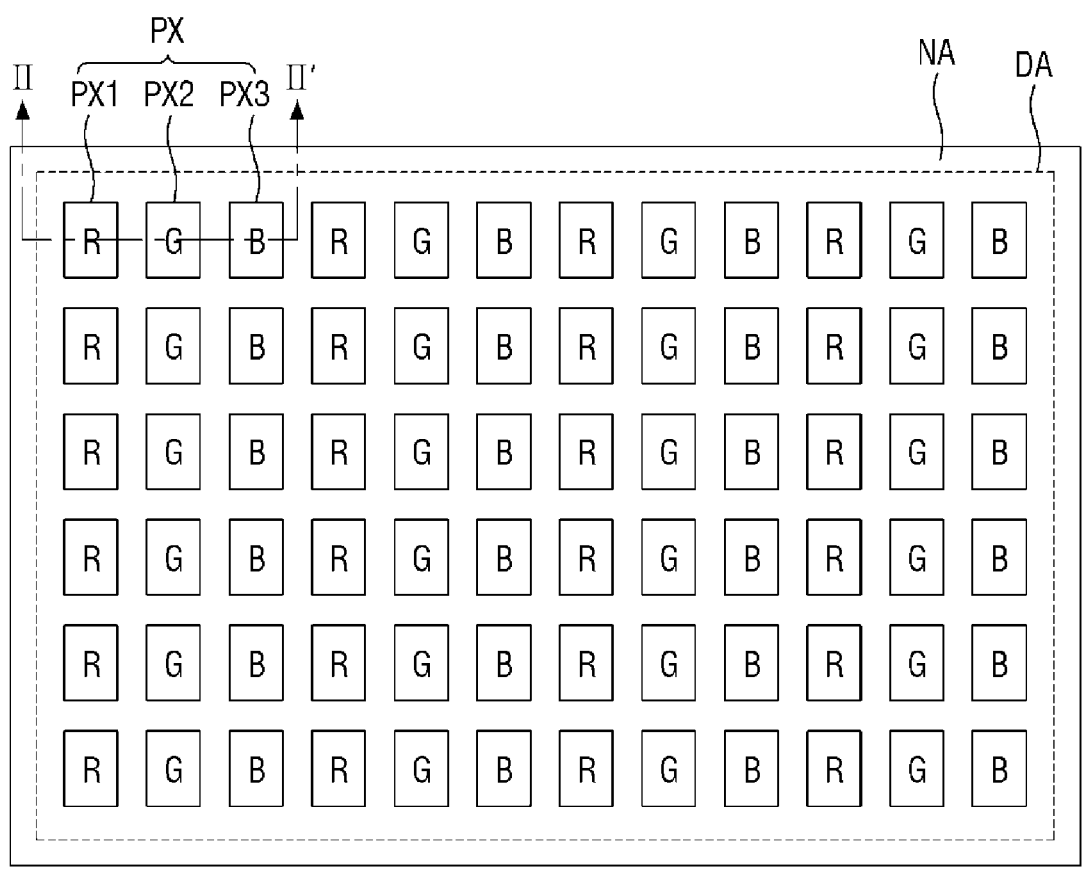
FIG. 1 is a schematic plan view of an organic light emitting display device according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a schematic plan view of an organic light emitting display device according to an exemplary embodiment.

Referring to FIG. 1, an organic light emitting display device may include a display area DA on which in a image is displayed in a plan view, and a non-display area NA on which the image is not displayed. The non-display area NA may be formed to surround the display area DA outside the display area DA.

A plurality of pixels PX is arranged in a matrix shape in the display area DA. Each pixel PX may include a first pixel PX1 emitting a first color, a second pixel PX2 emitting a second color, and a third pixel PX3 emitting a third color. According to an exemplary embodiment, FIG. 1 illustrates that the first color, second color, and third color are red, green, and blue, respectively.

The plurality of pixels PX may be configured such that the first pixel PX1, the second pixel PX2, and the third pixel PX3 are alternately arranged in a horizontal direction of the plane, and the pixels emitting the same color are continuously arranged in a vertical direction of the plane. However, the exemplary embodiments are not limited thereto.

Figure 2:
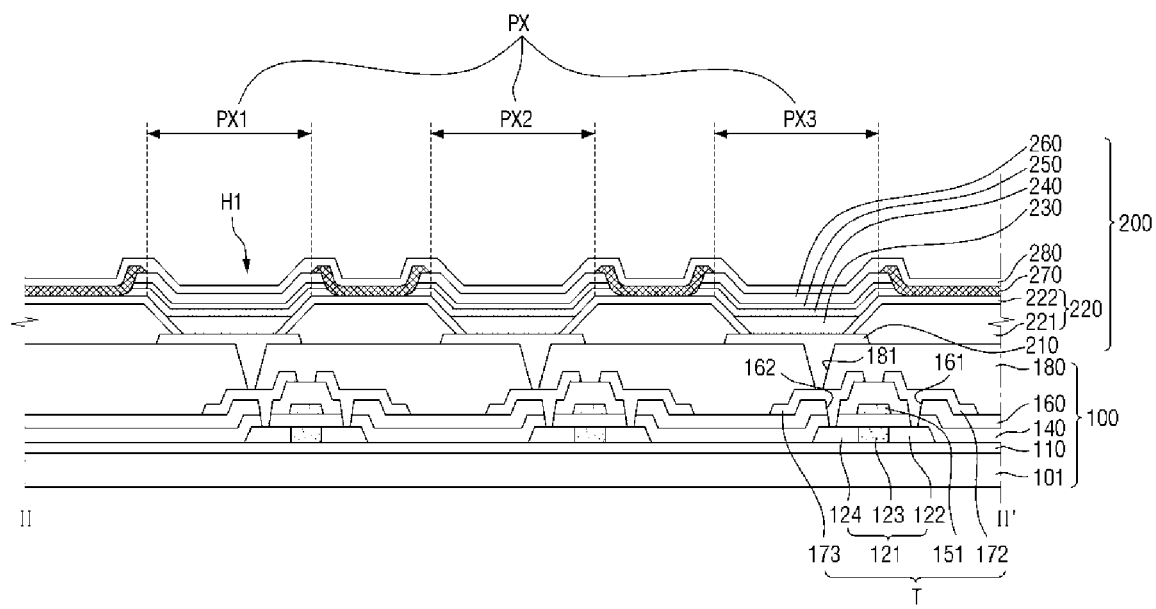
FIG. 2 is cross-sectional view of the organic light emitting display device taken along a sectional line II-IF of FIG. 1.

FIG. 2 is cross-sectional view of the organic light emitting display device taken along a sectional line II-IF of FIG. 1.

Referring to FIG. 2, the organic light-emitting display device may include a base substrate 101, a buffer layer 110, an active layer 121, a gate insulation layer 140, a gate electrode 151, an interlayer insulation layer 160, a source electrode 172, a drain electrode 173, a planarization layer 180, and an organic light-emitting element 200.

The base substrate 101 may be an insulation substrate. The base substrate 101 may include at least one of glass and plastic. The base substrate 101 may be transparent, and may include an opaque material when it is applied to a front emission-type organic light-emitting display device.

According to exemplary embodiments, in order for the organic light-emitting display device to be flexible, the base substrate 101 may be made of a flexible material such as polyimide.

The buffer layer 110 may be disposed on the base substrate 101. The buffer layer 110 may contain at least one of silicon nitride ($SiN_X$), silicon oxide ($SiO_X$), and oxynitride ($SiO_XN_Y$), and may be a single layer or a multi-layer. The buffer layer 110 may prevent or reduce the penetration of impurities, moisture and/or external air which may cause degradation of characteristics of semiconductor and may planarize a surface.

The active layer 121 is disposed on the buffer layer 110. The active layer 121 may contain semiconductor, and may be made of polysilicon.

The active layer 121 may include a channel region 123, and a source region 122 and drain region 124 adjacent to both sides of the channel region 123. The channel region 123 may include an intrinsic semiconductor, which is polysilicon not doped with impurities, and the source region 122 and the drain region 124 may be made of an impurity semiconductor, which is polysilicon doped with conductive impurities.

The gate insulation layer 140 may be disposed on the active layer 121. The gate insulation layer 140 may be an insulation layer including at least one of silicon nitride, silicon oxide, and silicon oxynitride, and may be a single layer or a multi-layer.

The gate electrode 151 may be disposed on the gate insulation layer 140. The gate electrode 151 may be disposed to overlap the channel region 123 of the active layer 121. The source region 122 and drain region 124 of the active layer 121 may not overlap the gate electrode 151. The gate electrode 151 may include at least one of aluminum (Al), molybdenum (Mo), copper (Cu), and an alloy thereof, and may have a multi-layer structure.

The interlayer insulation layer 160 may be disposed on the gate electrode 151. The interlayer insulation layer 160 may be an insulation layer including at least one of silicon nitride, silicon oxide, and silicon oxynitride, and may be a single layer or a multi-layer.

The source electrode 172 and the drain electrode 173 may be disposed on the interlayer insulation layer 160. The source electrode 172 may be disposed to overlap the source region 122 of the active layer 121, and the drain electrode 173 may be disposed to overlap the drain region 124 of the active layer 121.

Each of the source electrode 172 and the drain electrode 173 may including at least one of aluminum (Al), molybdenum (Mo), chromium (Cr), tantalum (Ta), titanium (Ti), other refractory metals, and an alloy thereof, and may have a multi-layer structure.

A source contact hole 161 and a drain contact hole 162 may be formed in the gate insulation layer 140 and the interlayer insulation layer 160 to electrically connect the source electrode 172 and the drain electrode 173 with contact with the source region 122 and the drain region 124 of the active layer 121, respectively.

The active layer 121, the gate electrode 151, the source electrode 172, and the drain electrode 173 may constitute a thin film transistor T. The gate electrode 151, the source electrode 172, and the drain electrode 173 of the thin film transistor T are a control terminal, an input terminal, and an output terminal of the thin film transistor T, respectively.

Each pixel PX may include at least one or more thin film transistors T. The thin film transistor T may be electrically connected with the organic light-emitting element 200 to control the driving of the organic light-emitting element 200.

The planarization layer 180 may be disposed on the source electrode 172 and the drain electrode 173. The planarization layer 180 may include at least one of silicon nitride, silicon oxide, silicon oxynitride, an acrylic organic compound having a low dielectric constant, benzocyclobutane (BCB), and perfluorocyclobutane (PFCB).

The planarization layer 180 may protect the source electrode 172 and the drain electrode 173 and planarize the upper surface thereof. A contact hole 181 is formed in the planarization layer 180 to expose the drain electrode 173 through the planarization layer 180.

The organic light-emitting element 200 may be disposed on the planarization layer 180, and may include a first conductive layer 210, a pixel defining film 220, an organic light-emitting layer 230, a second conductive layer 240, a capping layer 250, a protection layer 260, a sub-conductive layer 270, and a sub-protection layer 280.

The first conductive layer 210 may be disposed on the planarization layer 180 for each pixel PX. The first conductive layer 210 may be electrically connected with the drain electrode 173 of the thin film transistor T disposed for each pixel PX through the contact hole 181 formed in the planarization layer 180. The first conductive layer 210 may be a pixel electrode or anode electrode of the organic light-emitting element 200.

The first conductive layer 210 may contain a conductive material having a high work function. For example, the first conductive layer 210 may include at least one of a transparent conductive material, such as Indium Tin Oxide (ITO), Transparent Conductive Oxide (TCO), Indium Zinc Oxide (IZO), Zinc Oxide (ZnO), and Indium(III) oxide ($In_2O_3$). Moreover, the first conductive layer 210 may include a laminated film of a transparent conductive layer containing the above transparent conductive material and a conductive material layer including at least one of a reflective metal, such as lithium (Li), calcium (Ca), aluminum (Al), silver (Ag), magnesium (Mg), and gold (Au).

The pixel defining film 220 may be disposed on the planarization layer 180 to cover a part of the first conductive layer 210. The pixel defining film 220 may define each pixel PX of the organic light-emitting element 200. The pixel defining film 220 may include a first opening H1 for exposing at least a part of the first conductive layer 210 disposed in each pixel PX.

The pixel defining film 220 may be formed of a multi-layer including a first layer 221 including at least one of an organic material, such as an acrylic compound, polyimide (PI), benzocyclobutane (BCB) and perfluorocyclobutane (PFCB), and a second layer 222 including an inorganic material disposed covering the first layer 221. The second layer 222 of the pixel defining film 220 may be formed to cover the side wall of the first opening H1 as well as the upper surface of the first layer 221 of the pixel defining film 220.

The pixel defining film 220 including an organic material may prevent or reduce the damage to the first conductive layer 210 during the process of forming the first opening H1 by patterning and may simplify a manufacturing process. However, air and/or moisture may permeate into the organic light-emitting layer 230 through the pixel defining film 220. Therefore, the second layer 222 including an inorganic layer may prevent or reduce air and/or moisture from permeating into the pixel defining film 220.

The second layer 222 of the pixel defining film 220 may include at least one of an inorganic material, such as silicon nitride ($SiN_X$), silicon oxide ($SiO_X$), and silicon oxynitride ($SiO_XN_Y$), and may be disposed to completely cover the upper surface of the first layer 221 of the pixel defining film 220.

The organic light-emitting layer 230 may be disposed on the first conductive layer 210 exposed through the first opening H1. The organic light-emitting layer 230 may be formed of a multi-layer including a light-emitting layer and at least one or more of a hole injection layer, a hole transporting layer, an electron transporting layer, and an electron injection layer.

The organic light-emitting layer 230 may be surrounded and completely sealed by the protection layer 260, the second layer 222 of the pixel defining film 220, the first conductive layer 210 and the sub-conductive layer 270, each of which is made of an inorganic material. Accordingly, foreign matter and/or moisture may be effectively prevented or reduced from permeating into the organic light-emitting layer 230.

The organic light-emitting layers 230 disposed in the first pixel PX1, the second pixel PX2, and the third pixel PX3 may emit red, green, and blue colors, respectively.

The second conductive layer 240 may be disposed on the organic light-emitting layer 230. The second conductive layer 240 may cover a part of the upper surface of the pixel defining film 220.

The second conductive layer 240 may contain a conductive material having a low work function. For example, the second conductive layer 240 may include at least one of a metal, such as lithium (Li), calcium (Ca), LiF/Ca, LiF/Al, aluminum (Al), magnesium (Mg), silver (Ag), platinum (Pt), palladium (Pd), nickel (Ni), gold (Au), neodymium (Nd), iridium (Ir), chromium (Cr), barium fluoride (BaF), barium (Ba), Ytterbium (Yb), a compound or mixture thereof, and may also include at least one of a transparent conductive material, such as ITO, TCO, IZO, ZnO, and $In_2O_3$.

In an exemplary embodiment, the second conductive layer 240 may be a thin metal layer including at least one of Ag and Mg, a transparent conductive film including TCO, or a multi-layer in which the thin metal layer and the transparent conductive film are laminated. Thus, the light emitted from the organic light-emitting layer 230 disposed beneath the second conductive layer 240 may pass through the second conductive layer 240. However, the exemplary embodiments are not limited thereto.

The second conductive layer 240 may be disposed in an island shape disposed discontinuously in the first opening H1 of each pixel PX. Therefore, the second conductive layers 240 disposed in each pixel PX may not be in direct contact with each other. The second conductive layer 240 disposed in each pixel PX may be a cathode electrode of the organic light-emitting element 200, and may be a common electrode electrically connected through the sub-conductive layer 270.

The capping layer 250 may be disposed on the second conductive layer 240. The capping layer 250 can improve the light extraction efficiency of the organic light-emitting layer 230, and can protect the organic light-emitting layer 230 from plasma at the time of patterning the organic light-emitting element 200. According to the exemplary embodiments, the capping layer 250 may be omitted.

The protection layer 260 may be disposed on the capping layer 250. When the capping layer 250 is omitted, the protection layer 260 may be directly disposed on the second conductive layer 240.

The protection layer 260 may be disposed to encapsulate the underlying elements including the organic light-emitting layer 230, and can prevent or reduce damage to the organic light-emitting layer 230 from removing a photoresist formed during process of patterning the organic light-emitting element 200. Therefore, by disposing the protection layer 260, an expensive lift-off layer may be omitted. Further, the protection layer 260 may protect the formed organic light-emitting layer 230 from external shock, an etching material and/or external air when forming one kind of the organic light-emitting layer 230 in any one of pixel PX then forming another kind of the organic light-emitting layer 230 in another pixel PX.

The protection layer 260 may be disposed to cover the second conductive layer 240 and the capping layer 250 and expose a part of the second conductive layer 240. Specifically, a part of the outer portion of the second conductive layer 240 may be exposed and not be covered by the protection layer 260, and the second conductive layer 240 may be electrically connected with the sub-conductive layer 270 through the exposed portion.

The protection layer 260 may be disposed in each pixel PX. Thus, the protection layers 260 disposed in the respective pixels PX may be disposed not to be in contact with each other.

The protection layer 260 may include at least one of an inorganic material, such as silicon nitride ($SiN_X$), silicon oxide ($SiO_X$), and silicon oxynitride ($SiO_XN_Y$).

The sub-conductive layer 270 may be disposed on the pixel defining film 220 between the respective pixels PX. Thus, the sub-conductive layer 270 may be disposed outside any one pixel PX. The sub-conductive layer 270 is in contact with the exposed portion of the second conductive layer 240 of the adjacent pixel PX, thereby electrically connecting the second conductive layers 240 disposed in the different pixels PX with each other.

In an exemplary embodiment, the sub-conductive layer 270 may be disposed to fill a space or boundary between the plurality of pixels PX divided in a lattice shape in plan view, and to partially overlap the exposed portions of the second conductive layer 240 disposed in each pixel PX. The overlapped portion may be a portion where the sub-conductive layer 270 and the second conductive layer 240 are in contact with each other.

The sub-conductive layer 270 may be disposed to cover the surface of the pixel defining film 220 and at least a part of lateral surfaces of the second conductive layer 240, capping layer 250 and protection layer 260. The sub-conductive layer 270 may not be disposed on at least a part of the protection layer 260. For example, the sub-conductive layer 270 may not be disposed on the part of the protection layer 260 that overlaps the pixel PX region. Further, the sub-conductive layer 270 may not overlap the organic light-emitting layer 230.

The sub-conductive layer 270 may contain the material that can be contained in the second conductive layer 240, and may be made of the same material as the second conductive layer 240. Since the sub-conductive layer 270 may not be disposed on a path through which light is emitted from the organic light-emitting layer 230, the sub-conductive layer 270 may be formed to be thicker than the second conductive layer 240.

The sub-protection layer 280 may be disposed on the protection layer 260 to cover the protection layer 260 and the sub-conductive layer 270. The sub-protection layer 280 may complement the function of the protection layer 260, and may include the material of the protection layer 260, or may be made of the same material as the protection layer 260. The sub-protection layer 280 may be omitted.

Since the organic light-emitting display device according to the exemplary embodiment includes the organic light-emitting layer 230 surrounded and completely sealed by the protection layer 260, the second layer 222 of the pixel defining film 220, the first conductive layer 210, and the sub-conductive layer 270, foreign matter and/or moisture may be effectively prevented or reduced from permeating into the organic light-emitting layer 230.

Further, the organic light-emitting layer 230 can be packaged for each pixel by the protection layer 260 independently disposed in each pixel, and therefore, damage or defects caused in the organic light emitting layer 230 disposed in one pixel may not affect the organic light emitting layer 230 disposed in other pixels.

Figure 3:
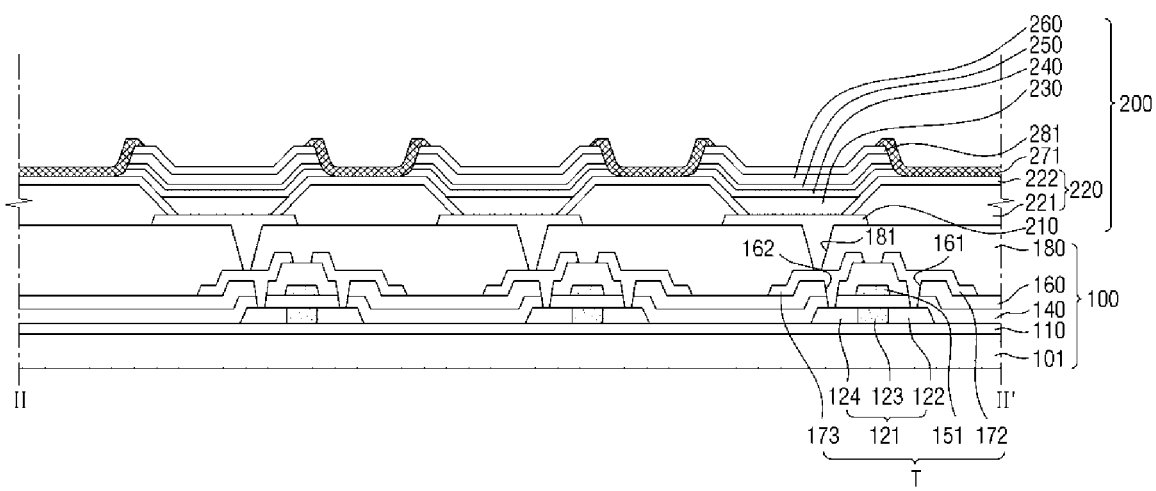
FIGS. 3, 4, and 5 are cross-sectional views of organic light-emitting display devices according to exemplary embodiments.

FIG. 3 is a cross-sectional view of an organic light-emitting display device according to an exemplary embodiment.

The organic light-emitting display device of FIG. 3 is substantially the same as the organic light-emitting display device illustrated in FIG. 2, except that a sub-protection layer 281 is disposed to cover only the protection layer 260 and not cover a sub-conductive layer 271. Hereinafter, redundant descriptions will be omitted.

Referring to FIG. 3, the sub-protection layer 281 may be disposed on the protection layer 260 to cover the protection layer 260. The sub-conductive layer 271 may be disposed on the pixel defining film 220 to cover at least a part of lateral surfaces of the second conductive layer 240, capping layer 250, protection layer 260, and the sub-protection layer 281.

Since the organic light-emitting display device shown in FIG. 3 includes the organic light-emitting layer 230 is surrounded and completely sealed by the protection layer 260, the second layer 222 of the pixel defining film 220, the first conductive layer 210, and the sub-conductive layer 270, foreign matter and/or moisture may be effectively prevented or reduced from permeating into the organic light-emitting layer 230. Further, the organic light-emitting layer 230 can be packaged for each pixel by the protection layer 260 independently disposed in each pixel, and therefore, damage or defects caused in the organic light emitting layer 230 disposed in one pixel may not affect the organic light emitting layer 230 disposed in other pixels.

Further, the sub-protection layer 281 is directly disposed on the protection layer 260, and therefore, the organic light emitting layer 230 may have increased protection.

Figure 4:
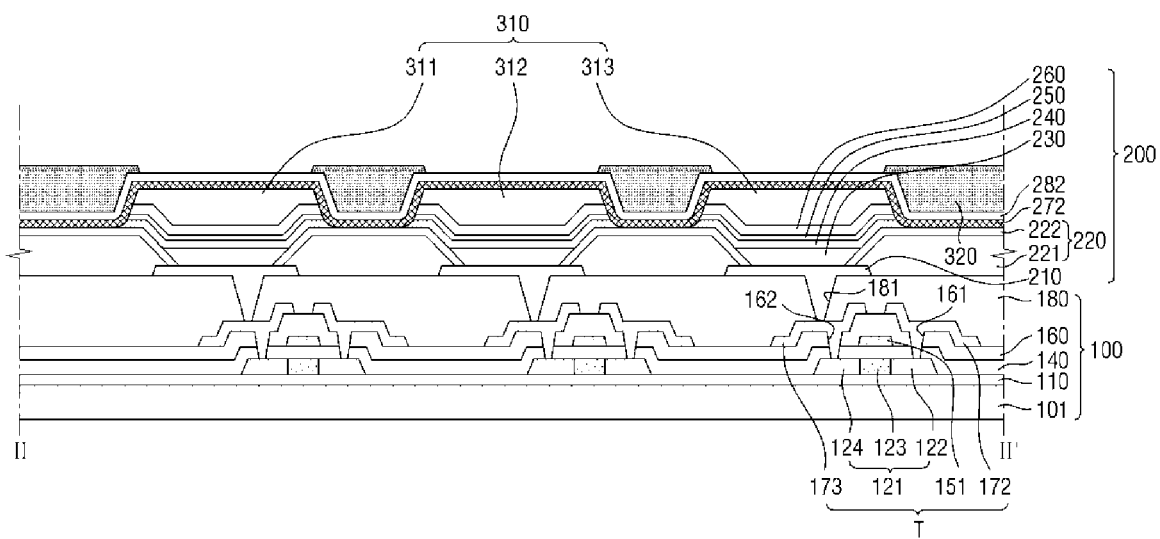

FIG. 4 is a cross-sectional view of an organic light-emitting display device according to an exemplary embodiment.

The organic light-emitting display device of FIG. 4 is substantially the same as the organic light-emitting display device illustrated in FIG. 2, except that a color filter 310, a sub-conductive layer 272, a sub-protection layer 282 and a black matrix 320 are sequentially laminated on the protection layer 260. Hereinafter, redundant descriptions will be omitted.

Referring to FIG. 4, the color filter 310 may be disposed on the protection layer 260. The color filter 310 may selectively transmit the light emitted from the organic light-emitting layer 230 disposed thereunder according to its wavelength.

The color filter 310 may be divided into a first color filter 311, a second color filter 312, and a third color filter, respectively corresponding to the first color, second color, and third color, and may be respectively disposed in the first pixel PX1, the second pixel PX2, and the third pixel PX3.

The sub-conductive layer 272 may be disposed on the color filter 310. The sub-conductive layer 272, unlike the sub-conductive layer 270 shown in FIG. 2, may be continuously disposed to cover all the exposed surfaces of the pixel defining film 220, the second conductive layer 240, the capping layer 250, the protection layer 260, and the color filter 310.

The sub-protection layer 282 may be disposed on the sub-conductive layer 272 to cover the sub-conductive layer 272.

The black matrix 320 may be disposed on the sub-protection layer 282 between the pixels PX. The black matrix 320 may guide the light emitted from the organic light-emitting layer 230 to be emitted to only the area confined to each pixel PX. Further, the black matrix 320 may also prevent or reduce the external light reflection by the sub-conductive layer 272 between the pixels PX.

Since the organic light-emitting display device shown in FIG. 4 includes the organic light-emitting layer 230 surrounded and completely sealed by the protection layer 260, the second layer 222 of the pixel defining film 220, the first conductive layer 210, and the sub-conductive layer 270, foreign matter and/or moisture may be effectively prevented or reduced from permeating into the organic light-emitting layer 230. Further, the organic light-emitting layer 230 can be packaged for each pixel by the protection layer 260 independently disposed in each pixel, and therefore, damage or defects caused in the organic light emitting layer 230 disposed in one pixel may not affect the organic light emitting layer 230 disposed in other pixels.

Figure 5:
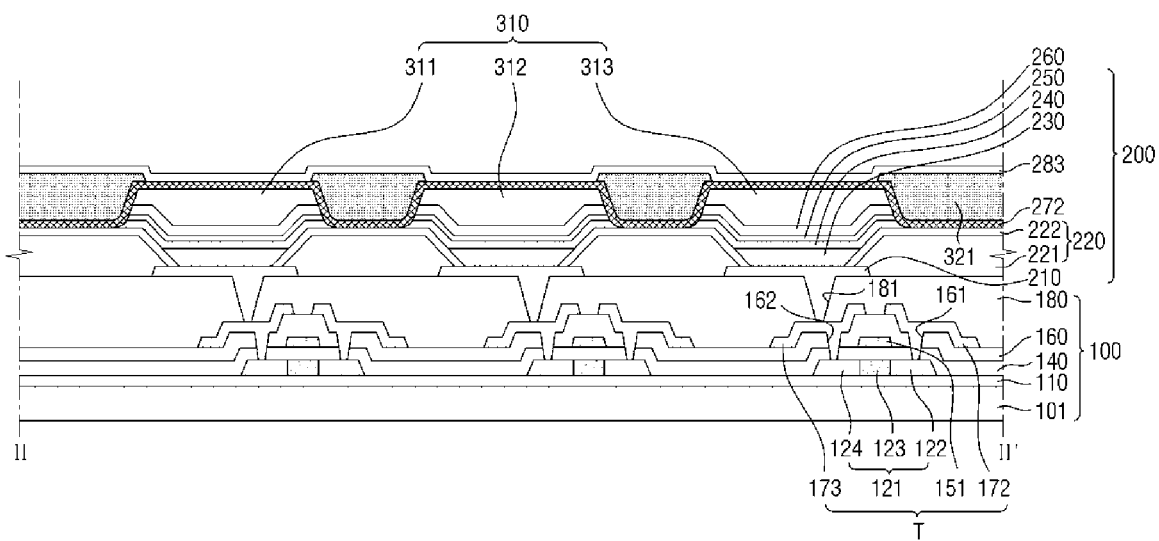

FIG. 5 is a cross-sectional view of an organic light-emitting display device according to an exemplary embodiment.

The organic light-emitting display device of FIG. 5 is substantially the same as the organic light-emitting display device illustrated in FIG. 4, except that a sub-protection layer 283 is disposed on a black matrix 321. Hereinafter, redundant descriptions will be omitted.

Referring to FIG. 5, the black matrix 321 may be disposed on the sub-conductive layer 272 between the pixels PX, and the sub-protection layer 283 may be disposed on the black matrix 321 to cover the black matrix 321 and the sub-conductive layer 272.

Since the organic light-emitting display device shown in FIG. 5 includes the organic light-emitting layer 230 surrounded and completely sealed by the protection layer 260, the second layer 222 of the pixel defining film 220, the first conductive layer 210, and the sub-conductive layer 270 may be completely sealed, Thus, foreign matter and/or moisture may be effectively prevented or reduced from permeating into the organic light-emitting layer 230. Further, the organic light-emitting layer 230 can be packaged for each pixel by the protection layer 260 independently disposed in each pixel, and therefore, damage or defects occurring in the organic light emitting layer 230 disposed in one pixel may not affect the organic light emitting layer 230 disposed in other pixels.

Further, since the sub-protection layer is disposed to cover the black matrix 321, the black matrix 321 can also be protected from the permeation of moisture, external air, or foreign matter.

Hereinafter, exemplary methods of manufacturing the organic light-emitting display devices will be described, according to the exemplary embodiments.

FIGS. 6, 7, 8, 9, 10, 11, 12, 13, 14, 15, 16, 17, 18, 19, 20, and 20 are cross-sectional views illustrating method of manufacturing the organic light-emitting display device of FIG. 2, according to an exemplary embodiment.

Figure 6:
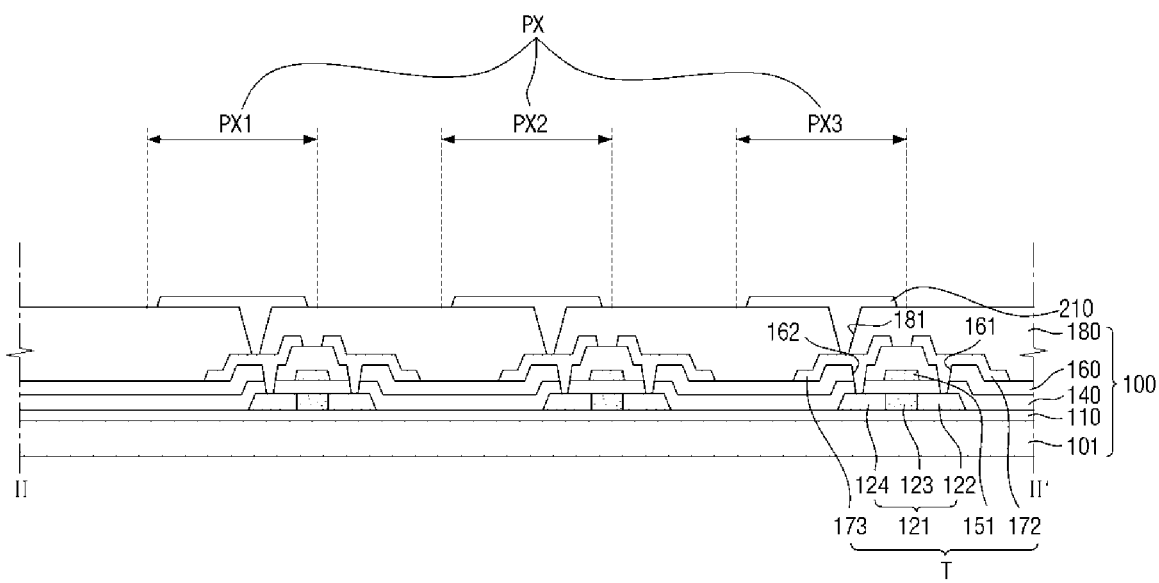
FIGS. 6, 7, 8, 9, 10, 11, 12, 13, 14, 15, 16, 17, 18, 19, 20, and 21 are cross-sectional views illustrating methods of manufacturing the organic light-emitting display devices of FIGS. 2 and 3, according to an exemplary embodiment.

Referring to FIG. 6, a buffer layer 110, an active layer 121, a gate insulation layer 140, a gate electrode 151, an interlayer insulation layer 160, a source electrode 172, a drain electrode 173, a planarization layer 180, and a first conductive layer 210 are disposed on a base substrate 101. Any conventional method may be used to dispose the elements illustrated in the FIG. 6.

Figure 7:
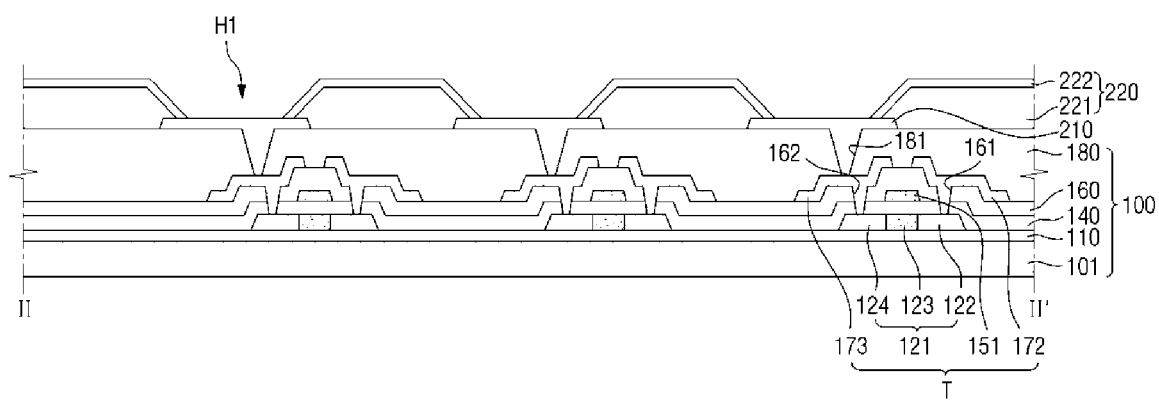

Referring to FIG. 7, a pixel defining film 220 including a first opening H1 exposing the first conductive layer 210 is disposed on the planarization layer 180. Specifically, a first layer 221 of the pixel defining film 220 is formed by laminating organic films including at least one of an acrylic compound, polyimide (PI), benzocyclobutane (BCB) and patterning the laminated organic films. Subsequently, a second layer 222 of the pixel defining film 220 is formed on the first layer 221 of the pixel defining film 220 by laminating inorganic films including at least one of an inorganic material, such as silicon nitride ($SiN_X$), silicon oxide ($SiO_X$), silicon oxynitride ($SiO_XN_Y$) and patterning the laminated inorganic films.

Figure 8:
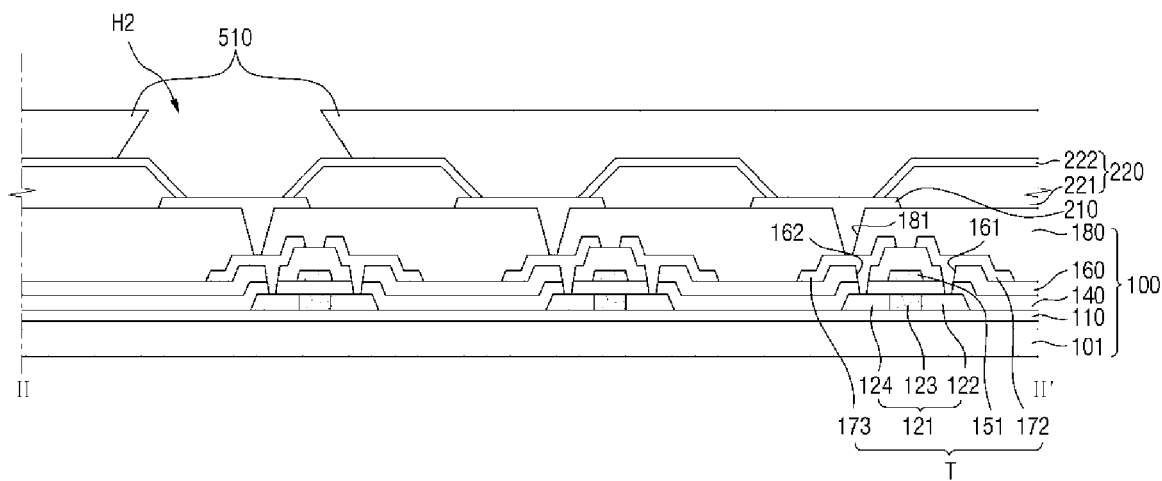

Referring to FIG. 8, subsequently, a first photoresist pattern 510 is disposed on the pixel defining film 220. The first photoresist pattern 510 may be formed by applying a photoresist composition onto the pixel defining film 220 to cover the pixel defining film 220 and the first opening H1 and then patterning the photoreisist composition. The photoresist composition may be patterned by aligning a mask, exposing the photoresist composition to light and then developing the exposed photoresist composition with a developer.

The first photoresist pattern 510 may be formed to define a second opening H2 exposing an area where a part of pixel PX is defined. Thus, the first photoresist pattern 510 may be formed to expose some pixels of a plurality of pixels PX and cover other pixels and elements. Referring to FIG. 8 the first photoresist pattern 510 is formed to expose only the area corresponding to the first pixel PX1 emitting the first color and cover the other area.

The first photoresist pattern 510 may be formed to have an inverted taper shape. In an exemplary embodiment, the first photoresist pattern 510 may be formed by patterning a negative photoresist composition, so as to have an inverted tape shape. However, the exemplary embodiments are not limited thereto.

Figure 9:
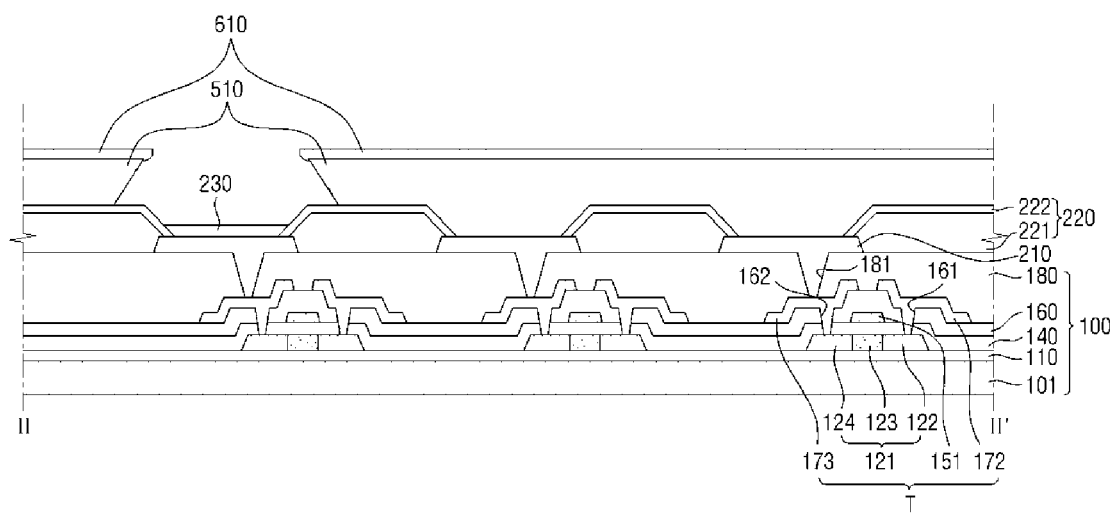

Referring to FIG. 9, subsequently, through the second opening H2, an organic light-emitting layer 230 is formed on the first conductive layer 210 exposed by the first opening H1. The organic light-emitting layer 230 may be deposited by a method, such as an evaporation method using a crucible.

The organic light emitting layer 230 may be formed by depositing a first deposition material including an organic light-emitting material on the first conductive layer 210 exposed by the second opening H2 and the first opening H1. The deposition of the first deposition material may be performed by a overall deposition without using a mask. Accordingly, the first deposition material is deposited not only onto the portion exposed through the second opening H2 but also on the first photoresist pattern 510, so as to form a first deposition layer 610.

The organic light-emitting layer 230 may be formed into a multi-layer by depositing a light-emitting layer and at least one of a hole injection layer, a hole transporting layer, an electron transporting layer, and an electron injection layer, and several kinds of deposition materials may be used in order to deposit the above layers. Accordingly, the first deposition layer 610 may also be formed into a multi-layer.

Figure 10:
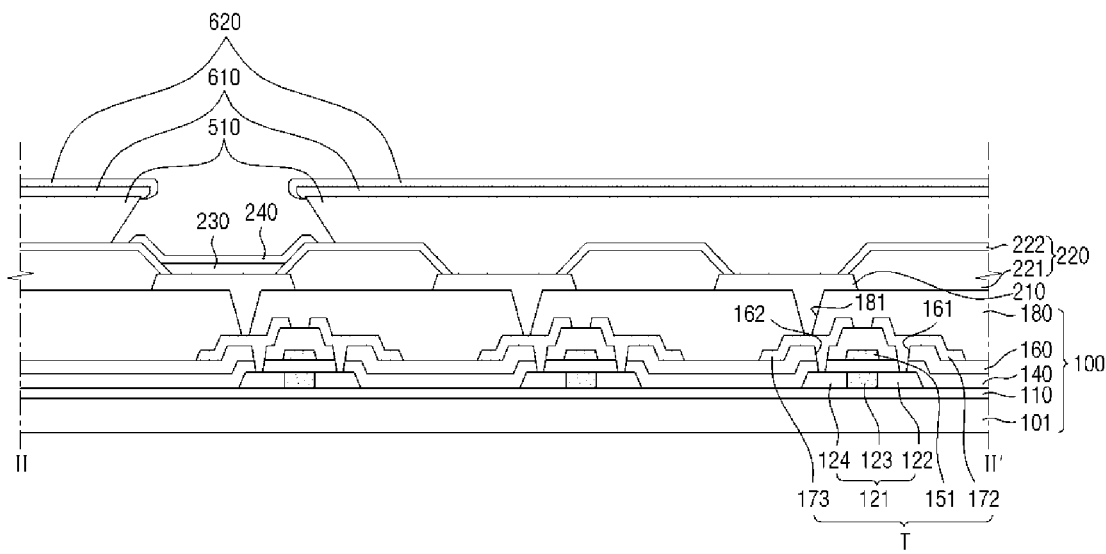

Referring to FIG. 10, subsequently, through the second opening H2, a second conductive layer 240 is formed on the organic light-emitting layer 230.

The second conductive layer 240 may be formed by applying a second deposition material including at least one of a metal, such as Ag, Mg, Al, and Yb, or a transparent conductive material, such as ITO, IZO, and TCO, onto the organic light-emitting layer 230 exposed by the second opening H2 using various methods including a sputtering method, a physical vapor deposition (PVD) method, a plating method, or the like.

The method of forming the second conductive layer 240 may be an isotropic method. Thus, the second conductive layer 240 may be formed to have a larger area than the second opening H2, and may be formed to cover the upper surface of the organic light-emitting layer 230 and a part of the lateral surface and upper surface of the pixel defining film 220.

The deposition of the second deposition material may also be an overall deposition without using a separate mask. Accordingly, the second deposition material is deposited not only on the portion exposed through the second opening H2 but also on the first deposition layer 610 formed on the first photoresist pattern 510, so as to form a second deposition layer 620.

Figure 11:
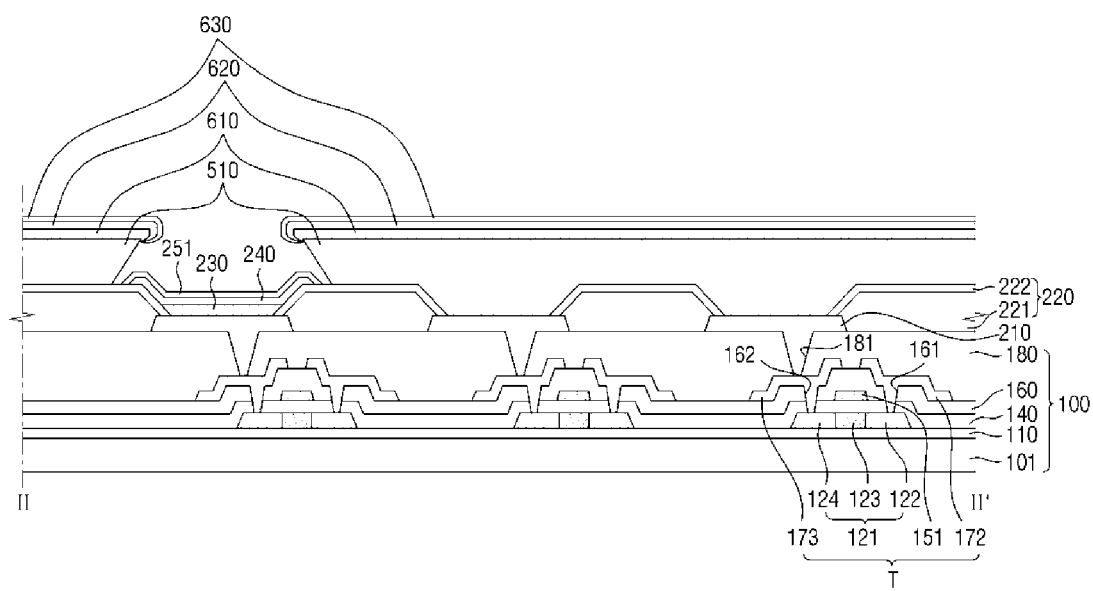

Referring to FIG. 11, subsequently, through the second opening H2, a capping layer 251 is formed on the second conductive layer 240. The capping layer 251 may be formed by depositing a third deposition material on the second conductive layer 240 exposed by the second opening H2.

The formation of the capping layer 251 may be an isotropic deposition process. Thus, the capping layer 251 may be formed to have a larger area than the second opening H2, and may be formed to cover the upper surface of the second conductive layer 240 and a part of the upper surface of the pixel defining film 220.

However, the exemplary embodiments are not limited thereto, and the capping layer 251 may be formed to cover only a part of the upper surface of the second conductive layer 240 according to process conditions.

The third deposition material is deposited not only on the portion exposed through the second opening H2 but also on the second deposition layer 620 formed on the first photoresist pattern 510, so as to form a third deposition layer 630.

The step of forming the capping layer 251 may be omitted. Thus, a protection layer 261 may be directly formed on the second conductive layer 240.

Figure 12:
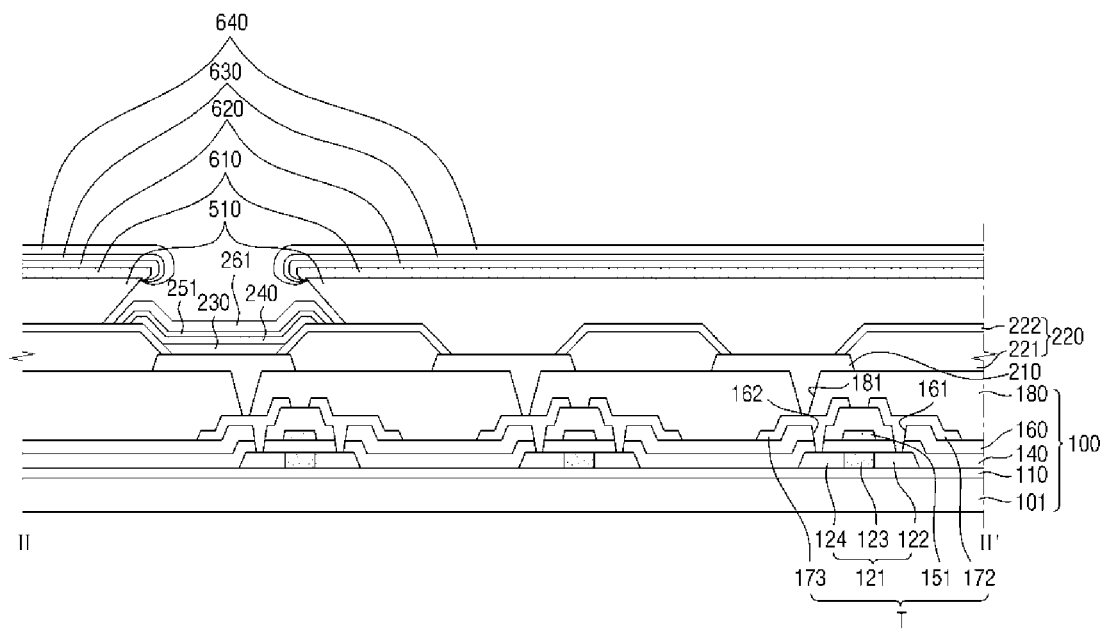

Referring to FIG. 12, subsequently, through the second opening H2, the protection layer 261 is formed on the capping layer 251. When the capping layer 251 is omitted, the protection layer 261 may be formed on the second conductive layer 240.

The protection layer 261 may be formed by depositing a fourth deposition material including at least one of an inorganic material, such as silicon nitride ($SiN_x$), silicon oxide ($SiO_x$), or silicon oxynitride ($SiO_xN_y$), onto the capping layer 251 exposed by the second opening H2.

The deposition of the fourth deposition material may be an isotropic process. Thus, the protection layer 261 may be formed to have a larger area than the second opening H2, and may be formed to cover the upper surfaces of the second conductive layer 240 and the capping layer 251 and a part of the upper surface of the pixel defining film 220.

The fourth deposition material is deposited not only on the portion exposed through the second opening H2 but also on the third deposition layer 630 formed on the first photoresist pattern 510, so as to form a fourth deposition layer 640.

The protection layer 261 may be formed to completely cover the organic light-emitting layer 230 and second conductive layer 240 disposed thereunder. Specifically, the outside of the protection layer 261 may be formed in contact with the pixel defining film 220 to prevent the organic light-emitting layer 230 and second conductive layer 240 disposed thereunder from being exposed.

Figure 13:
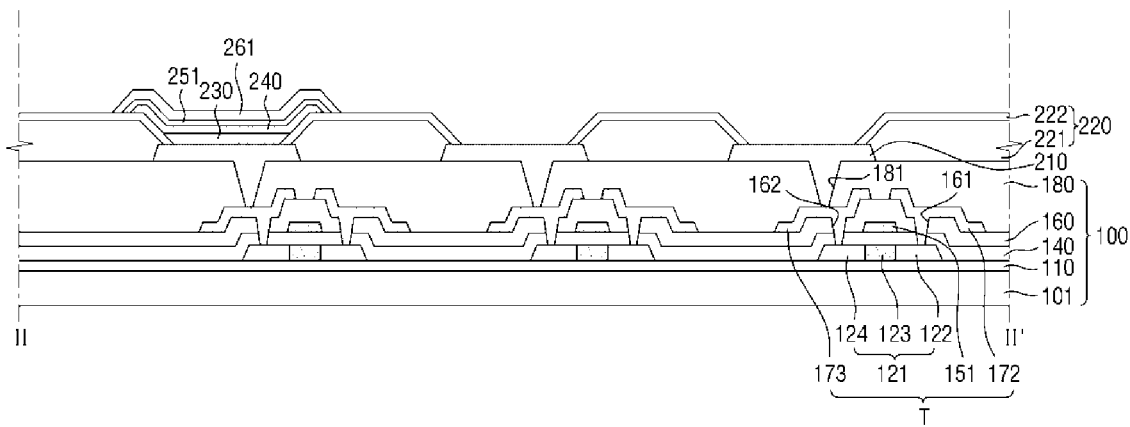

Referring to FIG. 13, subsequently, the first photoresist pattern 510 is removed. The first photoresist pattern 510 is removed, and thus the first, second, third, and fourth deposition layers 610, 620, 630, and 640 formed on the first photoresist pattern 510 may also be removed.

The first photoresist pattern 510 may be removed by a lift-off process using a stripper. When the first photoresist pattern 510 has an inverted tape shape, the lift-off process may be easily performed.

When the second conductive layer 240, the capping layer 251, and the protection layer 261 are deposited by chemical vapor deposition (CVD), the second conductive layer 240, the capping layer 251, and the protection layer 261 may be discontinuously formed without being connected with the second, third, and fourth deposition layers 620, 630, and 640 formed on the first photoresist pattern 510, and thus the lift-off process may be easily performed.

However, the exemplary embodiments are not limited thereto. Even by atomic layer deposition, the second conductive layer 240, the capping layer 251, and the protection layer 261 may be discontinuously formed with the second, third, and fourth deposition layers 620, 630, and 640, and thus the lift-off process may be easily performed.

Figure 14:
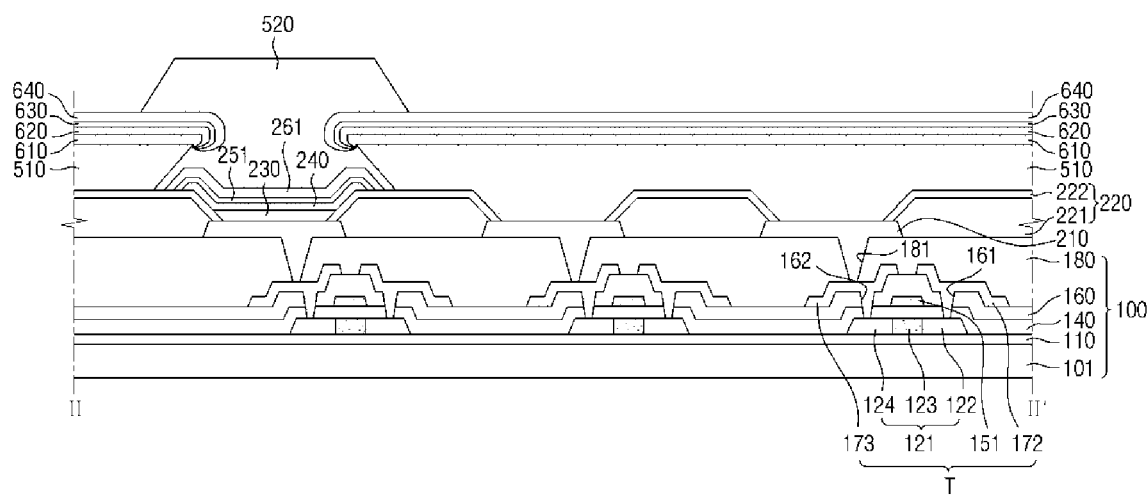

FIG. 14 is a cross-sectional view showing a method of removing the first photoresist pattern 510 according to an exemplary embodiment.

Referring to FIG. 14, a second photoresist pattern 520 is formed to fill the region exposed by the second opening H2 of FIG. 12. The second photoresist pattern 520 may be formed higher than the first photoresist pattern 510.

The second photoresist pattern 520 may be formed by applying a photoresist composition to cover the first photoresist pattern 510 and the second opening H2 and then patterning the photoresist composition.

The second photoresist pattern 520 may be formed to have a taper shape. In an exemplary embodiment, the second photoresist pattern 520 may be formed by patterning a positive photoresist composition, so as to have a taper shape. However, the exemplary embodiments are not limited thereto.

The first photoresist pattern 510 in the region where the second photoresist pattern 520 may be first removed, and the second photoresist pattern 520 may be subsequently removed, so as to form the state shown in FIG. 13.

The first photoresist pattern 510 and the second photoresist pattern 520 may include materials that can be removed by different strippers from each other. However, the exemplary embodiments are not limited thereto, and the first photoresist pattern 510 and the second photoresist pattern 520 may include materials that can be removed by the same stripper.

In an exemplary embodiment, the second, third, and fourth deposition layers 620, 630, and 640 made of an inorganic material and formed on the first photoresist pattern 510 are removed by dry etching, and then the first deposition layer 610 and the first and second photoresist patterns 510 and 520 are removed by wet etching. However, the exemplary embodiments are not limited thereto, and, any kind of removal methods, such as dry etching, wet etching, and ashing may be selected in any order appropriate.

The second photoresist pattern 520 is formed in the pixel (PX) region exposed by the second opening H2 and then removed, thereby preventing the elements, such as the organic light-emitting layer 230 and the protection layer 261, disposed in the pixel (PX) region, from being damaged when lifting-off the first photoresist pattern 510.

Figure 15:
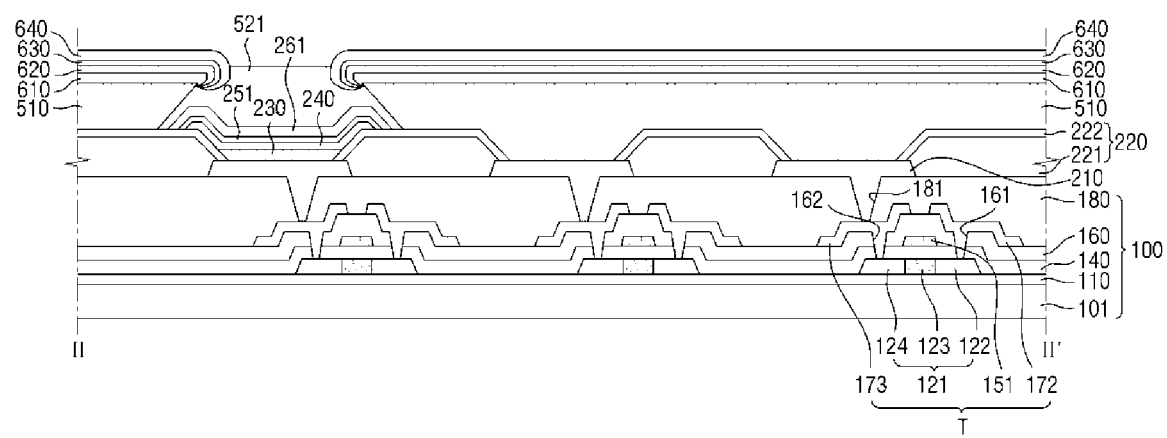

FIG. 15 is a cross-sectional view showing a method of removing the first photoresist pattern 510 according to an exemplary embodiment.

Referring to FIG. 15, a second photoresist pattern 521 is formed in the second opening H2 of FIG. 12. The second photoresist pattern 521 may be formed lower than the first photoresist pattern 510.

The second photoresist pattern 521 may be formed by applying a photoresist composition to cover the first photoresist pattern 510 and the second opening H2 and then front-developing the photoresist composition. When the photoresist composition is front-developed, the photoresist composition on the first photoresist pattern 510 is removed, and the second photoresist pattern 521 formed in the second opening H2 may be formed lower than the first photoresist pattern 510.

Subsequently, the first photoresist pattern 510 and the second photoresist pattern 521 are removed, so as to form the state shown in FIG. 13.

In an exemplary embodiment, the first photoresist pattern 510 and the second photoresist pattern 521 may include materials that can be removed by the same stripper. However, the exemplary embodiments are not limited thereto, and the first photoresist pattern 510 and the second photoresist pattern 521 may include materials that can be removed by different strippers from each other.

In an exemplary embodiment, the first photoresist pattern 510 may be removed by a first stripper, the second, third, and fourth deposition layers 620, 630, and 640 may be removed by dry etching, and then the second photoresist patterns 521 may be removed by a second stripper different from the first stripper, in the given sequence. Accordingly, it is possible to prevent or reduce generation of bulky inorganic particles which may clog filters during the process.

Figure 16:
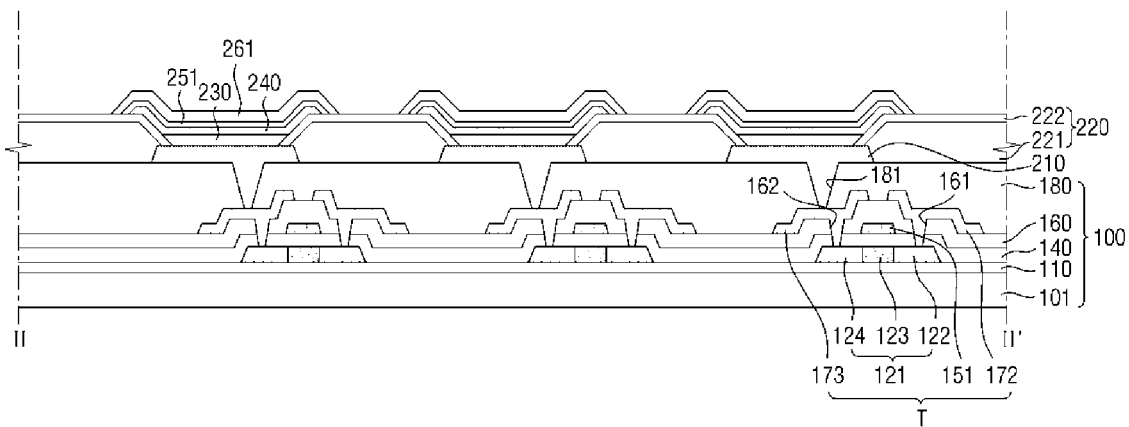

Referring to FIG. 16, the organic light-emitting layer 230, the second conductive layer 240, the capping layer 251, and the protection layer 261 are formed in the remaining pixel (PX) regions in the same manner illustrated in FIGS. 6, 7, 8, 9, 10, 11, 12, 13, 14, and 15.

It is shown in FIG. 16 that the above layers are formed in the second pixel PX2 emitting the second color and the third pixel PX3 emitting the third color. The organic light-emitting layers 230 in the second pixel PX2 and third pixel PX3 may emit the light having a wavelength different from that of the organic light-emitting layer in the first pixel PX1.

By disposing the protection layer 261 completely covering the organic light-emitting layer 230 and the second conductive layer 240, the previously disposed organic light-emitting layer 230 may be protected from external air, foreign matter, physical and chemical impacts occurring during the process, or the like during subsequent processes of forming an organic light-emitting element 200 for other pixels PX. The organic light-emitting layer 230 is surrounded by the first conductive layer 210 beneath the lower side thereof, the pixel defining film 220 on the lateral side thereof, and the protection layer 261 on the upper side thereof, so the organic light emitting layer 230 may be completely sealed.

Figure 17:
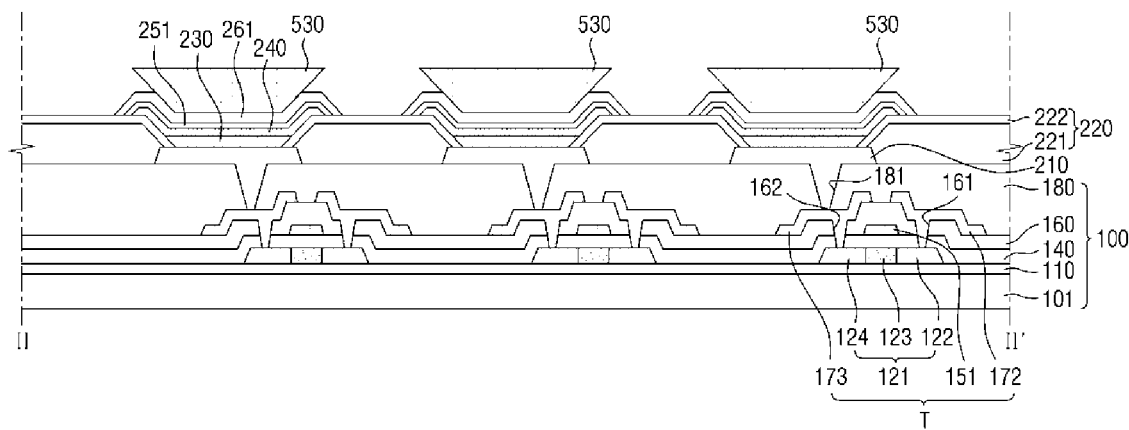

Referring to FIG. 17, subsequently, a third photoresist pattern 530 is formed on the protection layer 261. The third photoresist pattern 530 may be formed not to cover the outer side of the protection layer 261. Thus, some of the outer sides of the protection layer 261 and the second conductive layer 240 may not overlap the third photoresist pattern 530.

The third photoresist pattern 530 may have an inverted taper shape. Since the method of forming the third photoresist pattern 530 is substantially the same as the method of forming the first photoresist pattern 510, a redundant description will be omitted.

Figure 18:
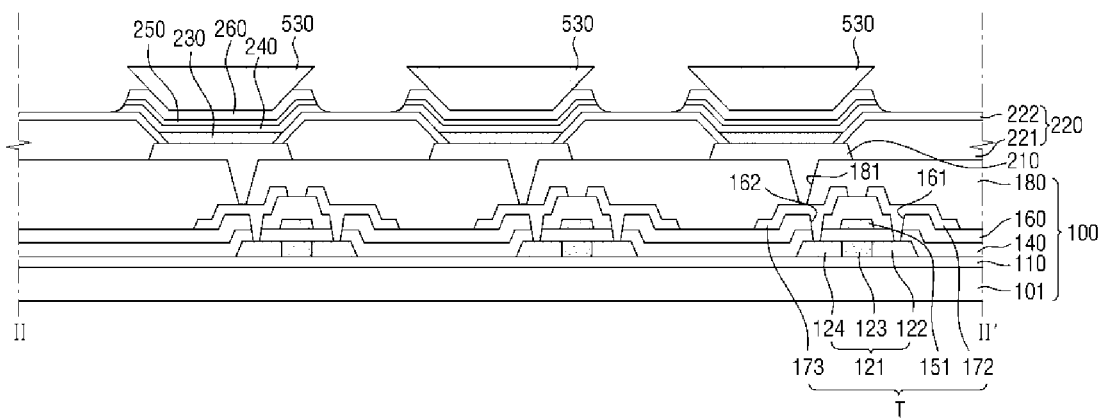

Referring to FIG. 18, subsequently, the capping layer 251 and the protection layer 261 are etched to expose at least a part of the second conductive layer 240. Specifically, portions of the capping layer 251 and the protection layer 261 that do not overlap the third photoresist pattern 530 in the outer side of the second conductive layer 240 may be etched.

Figure 19:
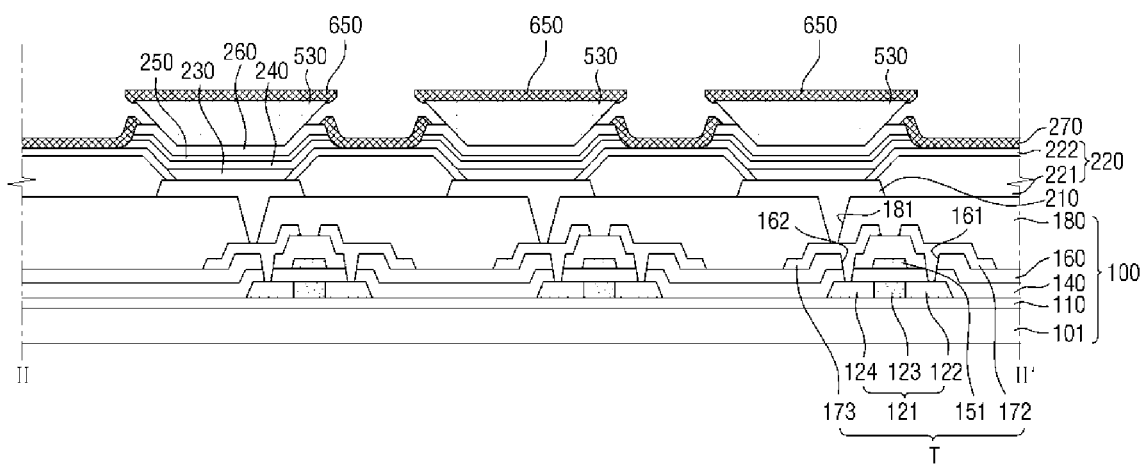

Referring to FIG. 19, subsequently, a sub-conductive layer 270 is disposed electrically connecting the exposed portions of the second conductive layer 240.

The sub-conductive layer 270 may electrically connect the second conductive layer 240 of one pixel PX with the second conductive layer 240 of each pixel PX, so as to function as a common electrode.

The sub-conductive layer 270 may be formed by applying a fifth deposition material including at least one of a metal, such as Ag, Mg, Al, and Yb, and a transparent conductive material, such as ITO, IZO, or TCO, onto the exposed portions of the pixel defining film 220 and the second conductive layer 240 by sputtering, physical vapor deposition (PVD), plating, or the like.

The sub-conductive layer 270 may be formed on the pixel defining film 220 to be in contact with the exposed portions of the second conductive layers 240 disposed in the pixels PX different from each other, and may also be partially in contact with the capping layer 250 and the protection layer 260.

Since the sub-conductive layer 270 is formed in the region between the pixels PX, not in the region where the pixel PX is defined, the sub-conductive layer 270 may be formed thicker than the second conductive layer 240.

The fifth deposition material is deposited even on the third photoresist pattern 530, so as to form a fifth deposition layer 650.

Figure 20:
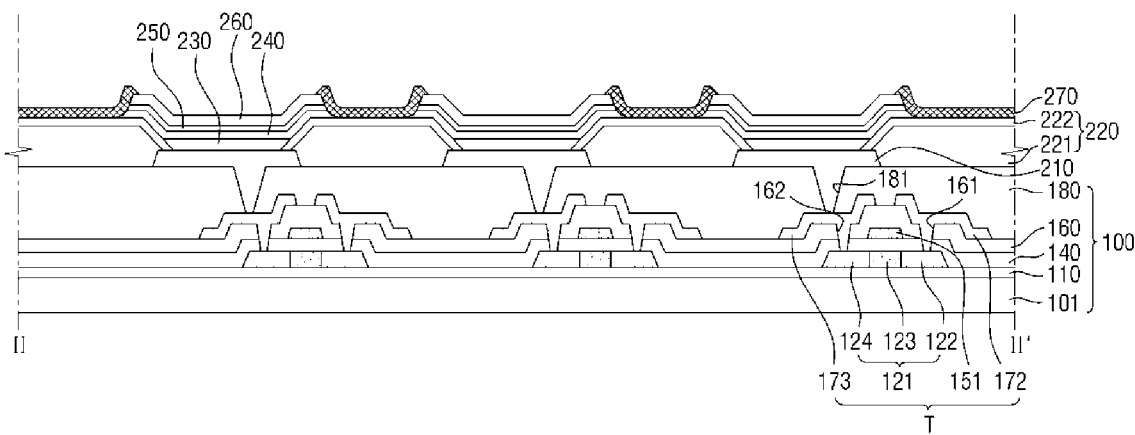

Referring to FIG. 20, subsequently, the third photoresist pattern 530 is removed. With the removal of the third photoresist pattern 530, the fifth deposition layer 650 formed on the third photoresist pattern 530 may also removed.

Figure 21:
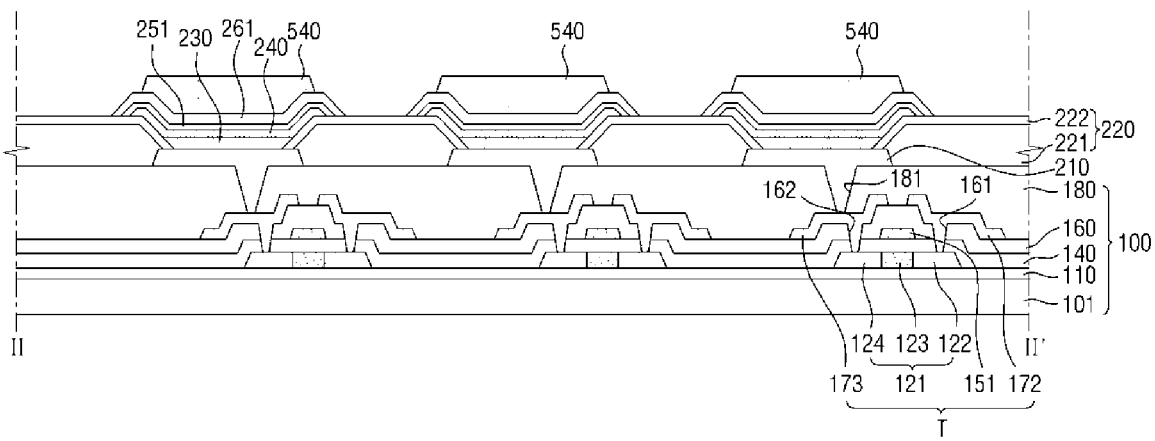

The third photoresist pattern 530 may be removed by a lift-off process using a stripper. When the third photoresist pattern 530 has an inverted tape shape, the lift-off process may be easily performed. However, the exemplary embodiments are not limited thereto, and, as shown in FIG. 21, a fourth photoresist pattern 540 having a taper shape may also be used.

Subsequently, a sub-protection layer 280 is formed, so as to manufacture the organic light-emitting display device shown in FIG. 2. Further, the organic light emitting display device shown in FIG. 3 may also be manufactured by reversing the formation order of the sub-conductive layer 270 and the sub-protection layer 280.

Figure 22:
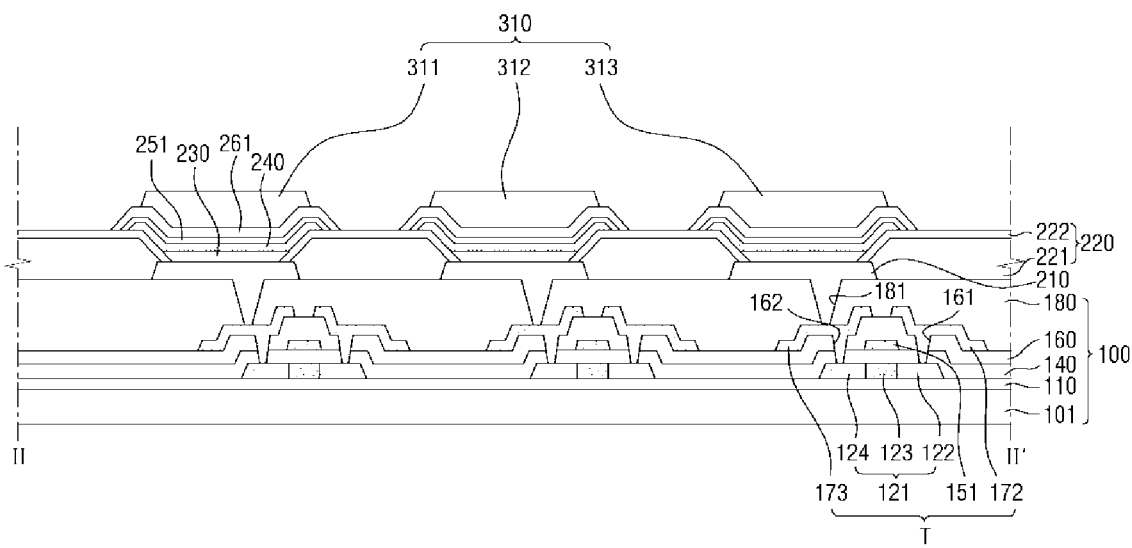
FIGS. 22, 23, and 24 are cross-sectional views illustrating methods of manufacturing the organic light-emitting display devices of FIGS. 4 and 5, according to an exemplary embodiment.
Figure 23:
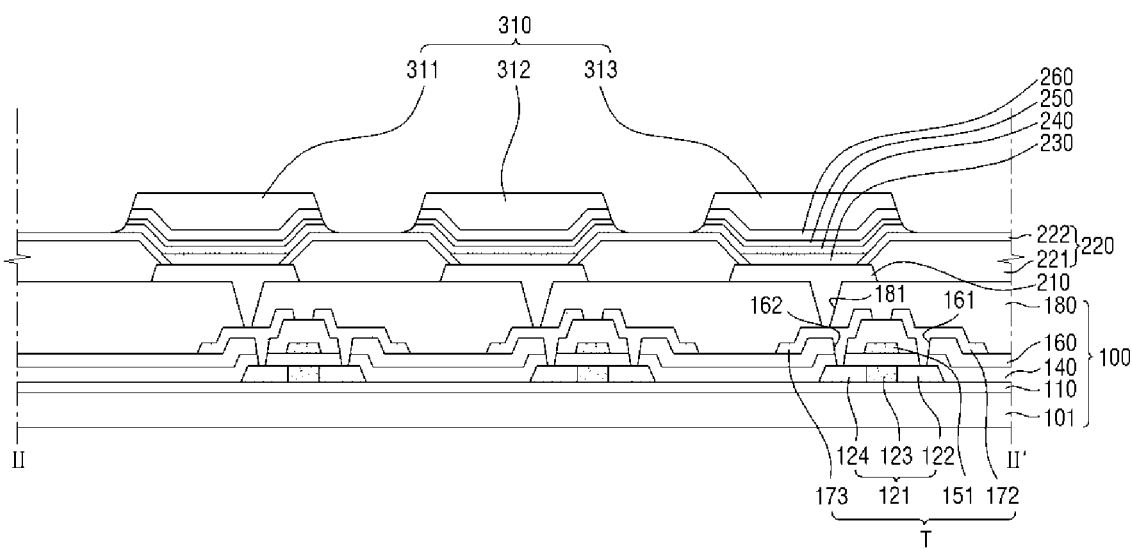
Figure 24:
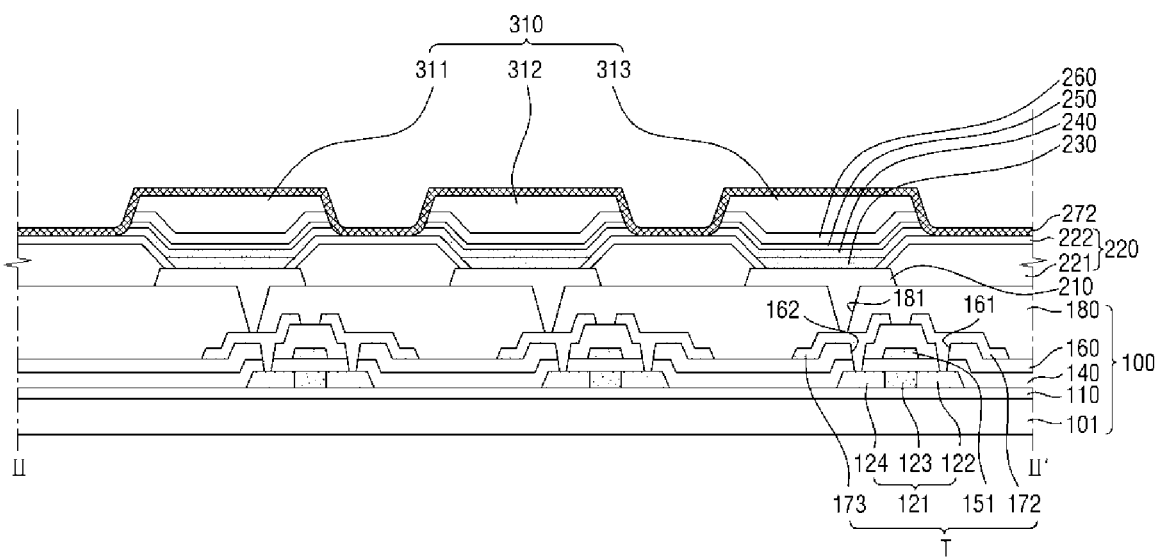

FIGS. 22, 23, and 24 are cross-sectional views illustrating methods of manufacturing the organic light-emitting display devices of FIGS. 4 and 5, according to an exemplary embodiment.

Referring to FIG. 22, a color filter 310 is formed on the protection layer 261 of FIG. 16. The color filter 310 may be formed not to cover the outer sides of the protection layer 261 and the second conductive layer 240. Thus, some of the outer sides of the protection layer 261 and the second conductive layer 240 may not overlap the color filter 310.

The color filter 310 may include a first color filter 311, a second color filter 312, and a third color filter 313, which filter a first color, a second color, and a third color, respectively, for each of the first pixel PX1, the second pixel PX2, and the third pixel PX3.

Referring to FIG. 23, subsequently, the capping layer 251 and the protection layer 261 are etched to expose at least a part of the second conductive layer 240. Specifically, portions of the capping layer 251 and the protection layer 261 that do not overlap the color filter 310 in the outer side of the second conductive layer 240 may be etched.

Referring to FIG. 24, subsequently, a sub-conductive layer 272 for connecting the exposed portions of the second conductive layer 240 is formed.

Since the color filter 310, unlike the third photoresist pattern 530 and the fourth photoresist pattern 540, is not separately removed, the sub-conductive layer 272, unlike the sub-conductive layer 270 of FIG. 20, may be continuously formed to cover all the exposed surfaces of the pixel defining film 220, the second conductive layer 240, the capping layer 250, the protection layer 260, and the color filter 310.

Subsequently, sub-protection layers 282 and 283 and black matrices 320 and 321 are formed on the sub-conductive layer 272, so as to manufacture the organic light-emitting display devices shown in FIGS. 4 and 5.

The exemplary embodiments may have following effects.

The organic light-emitting display device according to the exemplary embodiments may include a protection layer to prevent or reduce damage to an organic light-emitting layer from physical and chemical shocks generated from external air or a manufacturing process.

Moreover, the organic light-emitting display device according to the exemplary embodiments may include sub-conductive layers electrically connecting the second conductive layers of each pixel disconnected in the process of forming the protection layer.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A light-emitting display device, comprising:
   a substrate;
   a first conductive layer disposed on the substrate;
   a first insulating layer disposed on the first conductive layer, the first insulating layer including an opening exposing a portion of the first conductive layer;
   a light-emitting layer disposed on the portion of the first conductive layer;
   a second conductive layer disposed on the light-emitting layer;
   a second insulating layer disposed on the second conductive layer and exposing a portion of the second conductive layer; and
   a sub-conductive layer disposed on the first insulating layer, the sub-conductive layer contacting the portion of the second conductive layer,
   wherein the first insulating layer comprises:
      a first layer disposed on the first conductive layer; and
      a second layer disposed between the first layer and the sub-conductive layer.

2. The light-emitting display device of claim 1, wherein the second layer covers the first layer, and
   wherein the sub-conductive layer is in direct contact with the second layer of the first insulating layer.

3. The light-emitting display device of claim 2, wherein the first layer of the first insulating layer is not in contact with the sub-conductive layer, the second conductive layer, and the light-emitting layer.

4. The light-emitting display device of claim 2, wherein the first layer of the first insulating layer comprises an organic material, and
   wherein the second layer of the first insulating layer comprises an inorganic material.

5. The light-emitting display device of claim 1, wherein the second insulating layer comprises a plurality of second insulating layers, each of the plurality of the second insulating layers being separated from each other.

6. The light-emitting display device of claim 1, wherein the second conductive layer is in direct contact with the second layer of the first insulating layer.

7. The light-emitting display device of claim 5, wherein the second conductive layer comprises a plurality of second conductive layers, each of the plurality of the second conductive layers being separated from each other.

8. The light-emitting display device of claim 1, wherein a portion of the sub-conductive layer is disposed on an upper surface of the second insulating layer.

9. The light-emitting display device of claim 1, wherein the light-emitting layer is surrounded and sealed by the second insulating layer, the first insulating layer, the first conductive layer, and the sub-conductive layer.

10. The light-emitting display device of claim 1, wherein a portion of the second insulating layer does not overlap the sub-conductive layer in a plan view.

11. The light-emitting display device of claim 1, further comprising a sub-protection layer covering the second insulating layer and the sub-conductive layer, the sub-protection layer being in direct contact with the sub-conductive layer.

\* \* \* \* \*